United States Patent
Cavallo et al.

(10) Patent No.: US 9,059,335 B2
(45) Date of Patent: Jun. 16, 2015

(54) ANISOTROPIC CONDUCTING FILMS FOR ELECTROMAGNETIC RADIATION APPLICATIONS

(71) Applicant: Wisconsin Alumni Research Foundation, Madison, WI (US)

(72) Inventors: Francesca Cavallo, Madison, WI (US); Max G. Lagally, Madison, WI (US); Richard Rojas-Delgado, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 25 days.

(21) Appl. No.: 13/778,770

(22) Filed: Feb. 27, 2013

(65) Prior Publication Data

US 2014/0239201 A1  Aug. 28, 2014

(51) Int. Cl.
*H01L 31/00* (2006.01)
*H01L 21/02* (2006.01)
*H01L 29/16* (2006.01)

(52) U.S. Cl.
CPC .......... *H01L 31/00* (2013.01); *H01L 21/02381* (2013.01); *H01L 29/1606* (2013.01); *H01L 21/02532* (2013.01)

(58) Field of Classification Search
CPC .................................................. G01N 21/3581
USPC ...................... 250/493.1; 438/977
See application file for complete search history.

(56) References Cited

U.S. PATENT DOCUMENTS

| | | | |
|---|---|---|---|
| 2008/0088227 A1* | 4/2008 | Lee | 313/504 |
| 2008/0187463 A1* | 8/2008 | Wells | 422/82.08 |
| 2010/0317132 A1* | 12/2010 | Rogers et al. | 438/27 |
| 2012/0119837 A1 | 5/2012 | Blick et al. | |

OTHER PUBLICATIONS

F. Conaccorso, Z. Sun, T. Hasan, A. C. Ferrari; Graphene photonics and optoelectronics; Nature Photonics; Aug. 31, 2010; NPHOTON. 2010.186; pp. 611-622.*
Chen et al., Bright Infrared Emission from Electrically Induced Excitons in Carbon Nanotubes, Science, vol. 310, Nov. 18, 2005, pp. 1171-1174.
Mann et al., Electrically driven thermal light emission from individual single-walled carbon nanotubes, Nature Nanotechnology, vol. 2, Jan. 3, 2007, pp. 33-38.
Rodriguez et al., Unique prospects for graphene-based terahertz modulators, Applied Physics Letters, vol. 99, No. 113104, Sep. 12, 2011.
Zhang et al., Effect of surface bonding on semiconductor nanoribbon wiggling structure, Applied Physics Letters, vol. 96, No. 111904, Mar. 17, 2010.
Cooper et al., Experimental Review of Graphene, ISRN Condensed Matter Physics, vol. 2012, Article ID 501686, 2012, pp. 1-56.

* cited by examiner

*Primary Examiner* — Jack Berman
*Assistant Examiner* — Kevin Chung
(74) *Attorney, Agent, or Firm* — Bell & Manning, LLC

(57) ABSTRACT

Electronic devices for the generation of electromagnetic radiation are provided. Also provided are methods for using the devices to generate electromagnetic radiation. The radiation sources include an anisotropic electrically conducting thin film that is characterized by a periodically varying charge carrier mobility in the plane of the film. The periodic variation in carrier mobility gives rise to a spatially varying electric field, which produces electromagnetic radiation as charged particles pass through the film.

16 Claims, 7 Drawing Sheets

ANISOTROPIC CONDUCTING FILMS FOR ELECTROMAGNETIC RADIATION APPLICATIONS

REFERENCE TO GOVERNMENT RIGHTS

This invention was made with government support under FA9550-08-1-0337 awarded by the USAF/AFOSR and DE-FG02-03ER46028 awarded by the US Department of Energy. The government has certain rights in the invention.

BACKGROUND

Terahertz (THz) radiation has a wide range of useful applications, many of which would benefit from a compact THz radiation source capable of operating at room temperature and in continuous-wave mode. Unfortunately, currently available THz sources are typically bulky, involve complex architectures and operate at low temperatures or in vacuum.

The two architectures that have arguably shown the most promise for the fabrication of compact, solid-state semiconductor based THz sources are quantum cascade (QC) architectures and CMOS-compatible oscillators connected in a ring architecture. However, the multilayer structures in a QC architecture are generally microns thick and, therefore, are not amenable to stretching and deformation.

In a CMOS oscillator-based source, THz frequencies are obtained by coupling several oscillators in a ring using a set of complex circuits. The oscillators lock-in at equilibrium at a certain frequency. The topology of the ring and the circuits connecting the oscillators can be designed to obtain the desired radiation frequency. Providing tunable frequencies and power in such devices requires including more oscillators in the ring, fabricating multiple rings, or modifying the circuits interconnecting the oscillators. This results in an increase in complexity and occupied area on-chip.

SUMMARY

Sources of electromagnetic radiation, including radiation having THz frequencies, and methods of using the sources are provided. The sources include an anisotropic electrically conducting thin film that is characterized by a periodically varying charge carrier mobility in the plane of the film. The periodic variation in carrier mobility gives rise to a spatially varying electric field, which produces electromagnetic radiation as the charges pass through the film.

One embodiment of an electromagnetic radiation source comprises: (a) a substrate having a surface, the surface comprising a plurality of surface segments of a first material and a plurality of surface segments of a second material, wherein the surface segments of the first and second materials are arranged in a periodic pattern; (b) an electrically conducting film comprising an electrically conducting material disposed over the surface of the substrate; and (c) first and second electrical contacts in electrical communication with the electrically conducting film. The radiation source is constructed such that the mobility of charge carriers in regions of the electrically conducting film that are disposed on surface segments of the first material differs from the mobility of the charge carriers in regions of the electrically conducting film that are disposed on surface segments of the second material. As a result, the charge carriers experience a periodically varying mobility within the plane of the electrically conducting film. This gives rise to a spatially varying electric field that can be used to generate electromagnetic radiation when charge carriers pass through the film. Monolayer graphene is one example of an electrically conducting material that can be employed as the electrically conducting film. Group IV semiconductors, such as silicon and germanium, or even air are examples of materials that can be used as the first material, while silicon dioxide is an example of a material that can be used as the second material.

In methods of generating electromagnetic radiation using the present sources a voltage is applied across the electrically conducting film to induce a flow of charge carriers in the film, whereby electromagnetic radiation is emitted from the exposed surface of the film.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1:
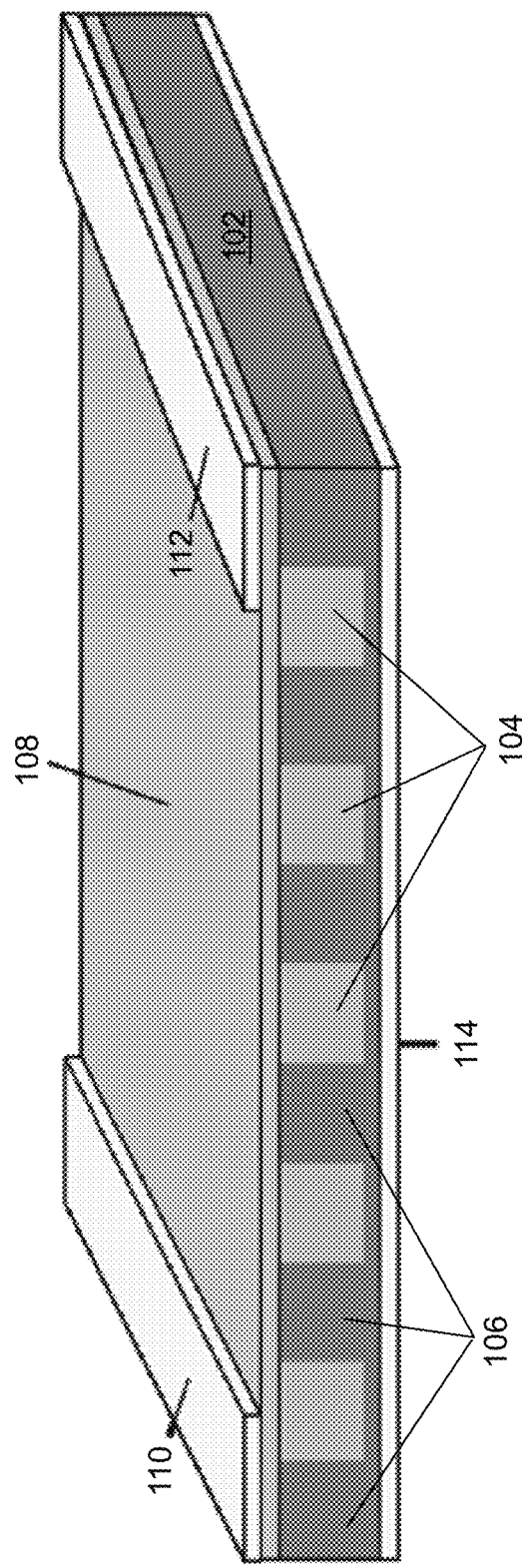
FIG. 1 is a schematic diagram of an electromagnetic radiation source.

Electronic devices for the generation of electromagnetic radiation ("electromagnetic radiation sources") are provided. Also provided are methods for using the devices to generate electromagnetic radiation. The sources can be designed to generate electromagnetic radiation over a broad frequency range, including radiation having terahertz frequencies, and can be operated at room temperature (i.e., 23° C.) in a continuous wave (CW) mode. Moreover, as discussed in detail below, the electronic devices can fabricated using relatively inexpensive growth processes and the resulting devices can be mechanically flexible, compact and tailored to provide electromagnetic radiation over a range of frequencies and powers through the appropriate selection of materials and device dimensions.

Applications for which the devices can be used include screening and security applications (e.g., in sensors for the detection of explosives and/or chemical or biological agents), imaging applications (e.g., in medical imaging devices for the detection of skin cancer or tooth decay), and in research and development applications (e.g., for quality control studies of drugs or the development of skin-care products).

The radiation sources include an anisotropic electrically conducting thin film that is characterized by a periodically varying charge carrier mobility in the plane of the film. The periodic variation in carrier mobility gives rise to a spatially varying electric field, which results in the emission of electromagnetic radiation as charge carriers pass through the film.

The basic structure upon which the electromagnetic radiation sources are based comprises an electrically conducting film disposed on a substrate having a periodically patterned surface. In this structure, the charge carrier mobility in the thin film is limited to a large extent by the interaction of the carriers with interfacial states at the thin film/substrate surface interface. As a result, the periodically patterned substrate material produces a corresponding periodically varying charge carrier mobility in the overlying thin film.

The periodically patterned substrate surface includes at least two different materials, each arranged periodically as a plurality of surface segments. Thus, the substrate surface comprises a plurality of surface segments of a first material and a plurality of surface segments of a second material, wherein the surface segments of the first and second materials are arranged in a regular periodic pattern. The first and second materials are selected such that the mobility of charge carriers in the regions of the thin film disposed on segments of the first material will differ from the mobility of the carriers in the regions of the thin film disposed on segments of the second material. The substrate surface may optionally include one or more additional sets of surface segments, comprising one or more additional materials, arranged in the periodic pattern in order to provide additional regions of differing carrier mobilities within the electrically conducting film.

The pattern defined by the surface segments can have a variety of geometries. For example, the surface segments may take the form of alternating stripes or alternating concentric rings. Thus, in embodiments in which only two different materials are used, the striped pattern can be an ABAB . . . type repeating pattern, wherein "A" represents the first material and "B" represents the second material. Similarly, an embodiment in which two different materials are arranged in a concentric ring pattern can have an ABAB . . . type repeating pattern across its diameter. (As used herein, the term ring includes shapes having a circular circumference, but also includes shapes having other circumferential profiles, such as square, elliptical, or rectangular.) The pattern can be defined in the substrate surface using, for example, lithographic patterning and material re-growth techniques or nanomembrane patterning and transfer techniques.

The substrate is desirably, but not necessarily, thin enough to render it mechanically flexible and/or stretchable. For example, some embodiments of the radiation sources may be sufficiently flexible that they can be formed into a curve with a radius of curvature of 1 cm or less (e.g., 1 mm or less) and still operate as a radiation source. In at least some embodiments, the substrate has a thickness of no greater than about 1 µm. (However, higher thicknesses and mechanically rigid substrates can also be employed.) It may be possible to tune the radiation generated by the flexible and stretchable devices because flexing (e.g., forming the devices into a curve, such as a cylinder or a coil) or stretching can change the periodicity of the pattern defined in the substrate surface, which, in turn, changes the frequency of the generated radiation, as discuss below.

The electrically conducting film can be grown or deposited directly on the surface of the substrate or may be transferred to the substrate surface using, for example, known nanomembrane or thin-sheet transfer techniques.

The electrically conducting film should be thin enough that interfacial states created at the interface between the film and the substrate surface control the charge carrier mobility within the film to a significant extent. The optimal film thickness will depend on the materials from which the film and the substrate are fabricated. By way of illustration only, some embodiments of the electrically conducting film will have a thickness of no greater than about 100 nm.

The radiation sources may also include first and second electrically conductive contacts configured to apply a voltage across the electrically conducting film and a voltage source in electrical communication with the contacts.

A description of a method for generating a spatially varying electric field using a periodically patterned substrate surface is described below with reference to the embodiment of an electromagnetic radiation source depicted in FIG. 1. However, it should be understood that this embodiment is used for illustrative purposes only and that the operational principles can be expanded and applied to other embodiments of the device.

FIG. 1 is a cross-sectional view of an electromagnetic radiation source in which the substrate 102 has a periodically patterned surface comprising a plurality of surface segments of a first material 104 and a plurality of surface segments of a second material 106. The segments are arranged in a regular alternating pattern to form a series of stripes running across the plane of the substrate. A planar layer of electrically conducting material provides the electrically conducting film 108 disposed over substrate 102. First and second contacts, 110 and 112, are disposed on conducting film 108. In the embodiment depicted in this figure, the device further comprises a back gate electrode 114 configured to apply a gate voltage across substrate 102 and film 108. Back gate electrode 114 can be used to tune the electric fields in the device.

Figure 2:
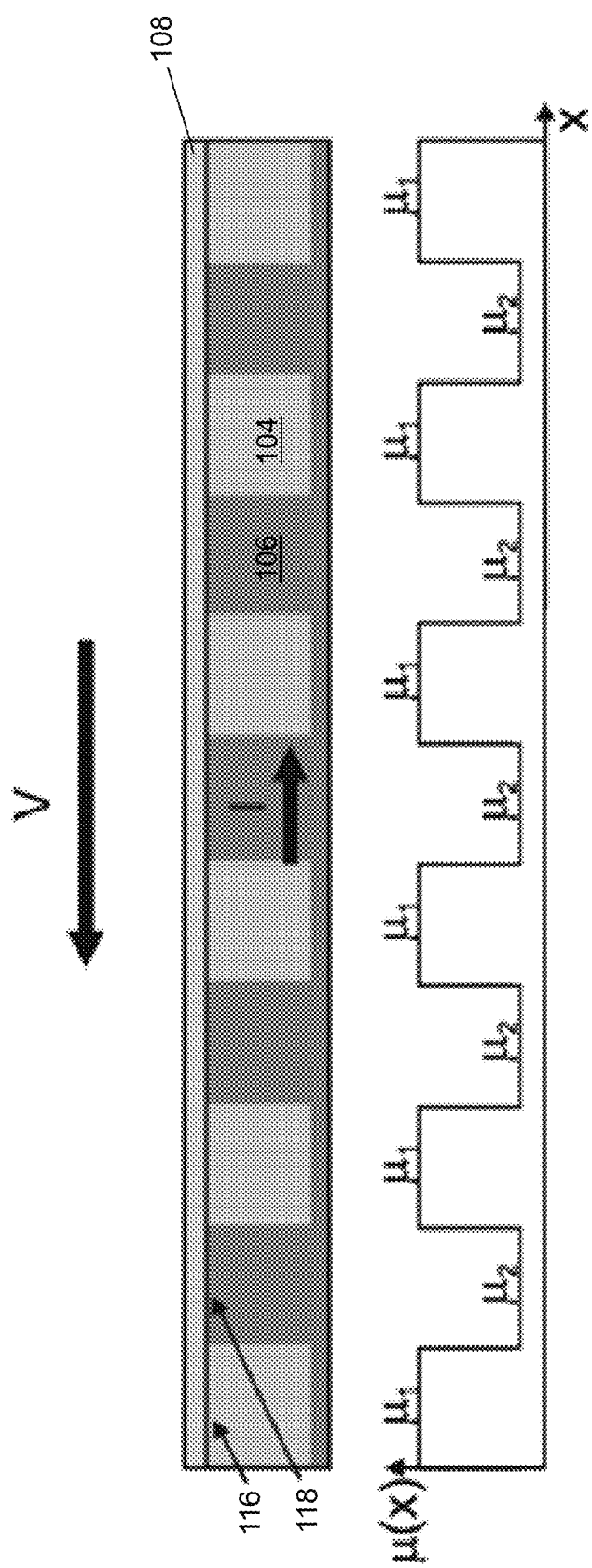
FIG. 2 is a schematic diagram showing a partial cross-sectional view of the radiation source of FIG. 1 (upper panel) and its corresponding charge carrier mobility profile (lower panel).

As shown in the mobility profile in the lower panel of FIG. 2, when a voltage $V_m$ is applied across first and second contacts 110 and 112, a current flows in which the charge carriers experience different carrier mobilities in regions of the film overlying different substrate material segments 116 and 118. In FIG. 2, the mobility ($\mu_1$) of charge carriers in film regions disposed on surface segments of the first material 104 is higher than the mobility ($\mu_2$) of the charge carriers in film regions disposed on surface segments of the second material 106.

Figure 3:
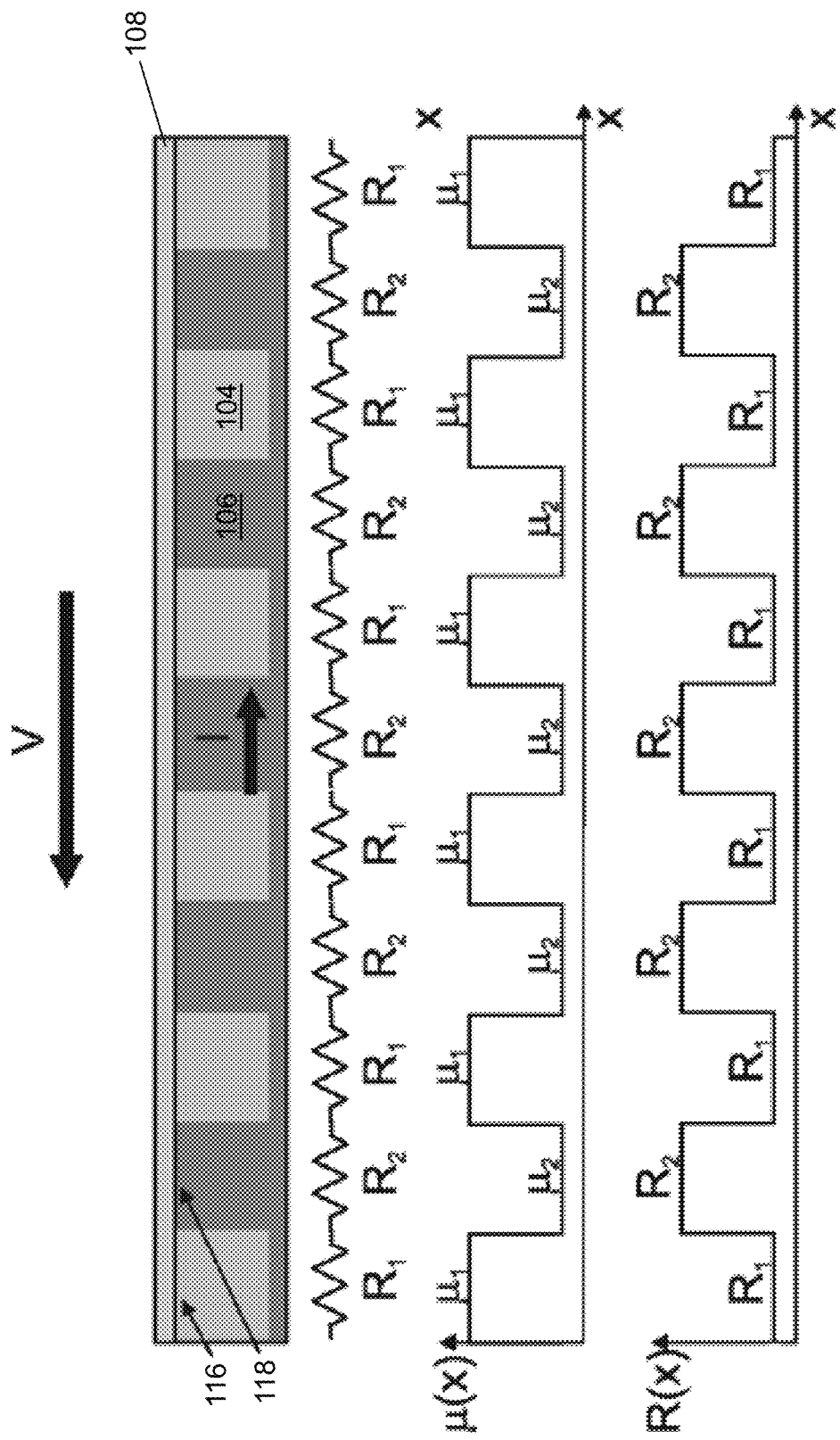
FIG. 3 is a schematic diagram showing a partial cross-sectional view of the radiation source of FIG. 1 (upper panel), its corresponding charge carrier mobility profile (middle panel), and its corresponding electrical resistance profile (lower panel).
Figure 4:
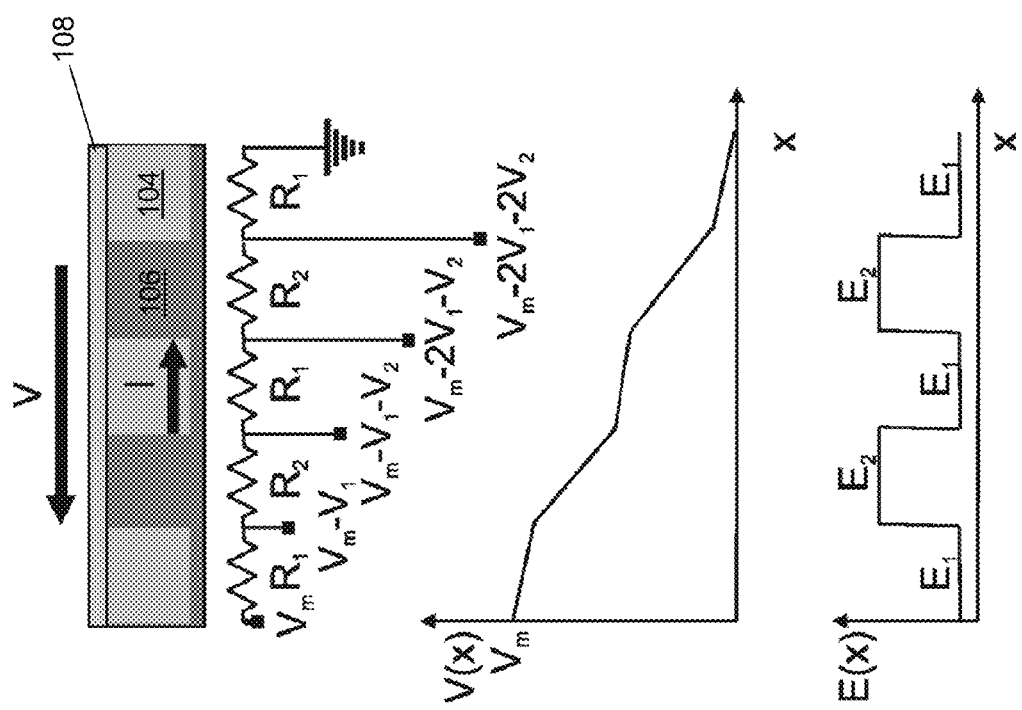
FIG. 4 is a schematic diagram showing a partial cross-sectional view of the radiation source of FIG. 1 and a model circuit representing the structure as a plurality of resistors connected in series (upper panel), a graph of the voltage drop across the electrically conducting film of the radiation source as a function of position (middle panel) and the electric field profile in the electrically conducting film (lower panel).

The lowermost panel in FIG. 3 shows the periodically varying electrical resistance profile across film 108, which is inversely related to the mobility profile and may be modeled by a plurality of resistors ($R_1$ and $R_2$) connected in series. In this series configuration, the current through all of the resistors is the same, but the voltage drop across each film region is proportional to its resistance. This is illustrated in the upper panel in FIG. 4 and the step-wise voltage drop across the film is illustrated in the graph in the middle panel of FIG. 4. Hence, because the local electric field in each region is proportional to the magnitude of the voltage drop across that region, the periodically varying carrier mobility in film 108 results in a periodically varying electric field, as shown in the lowermost panel of FIG. 4.

Figure 5:
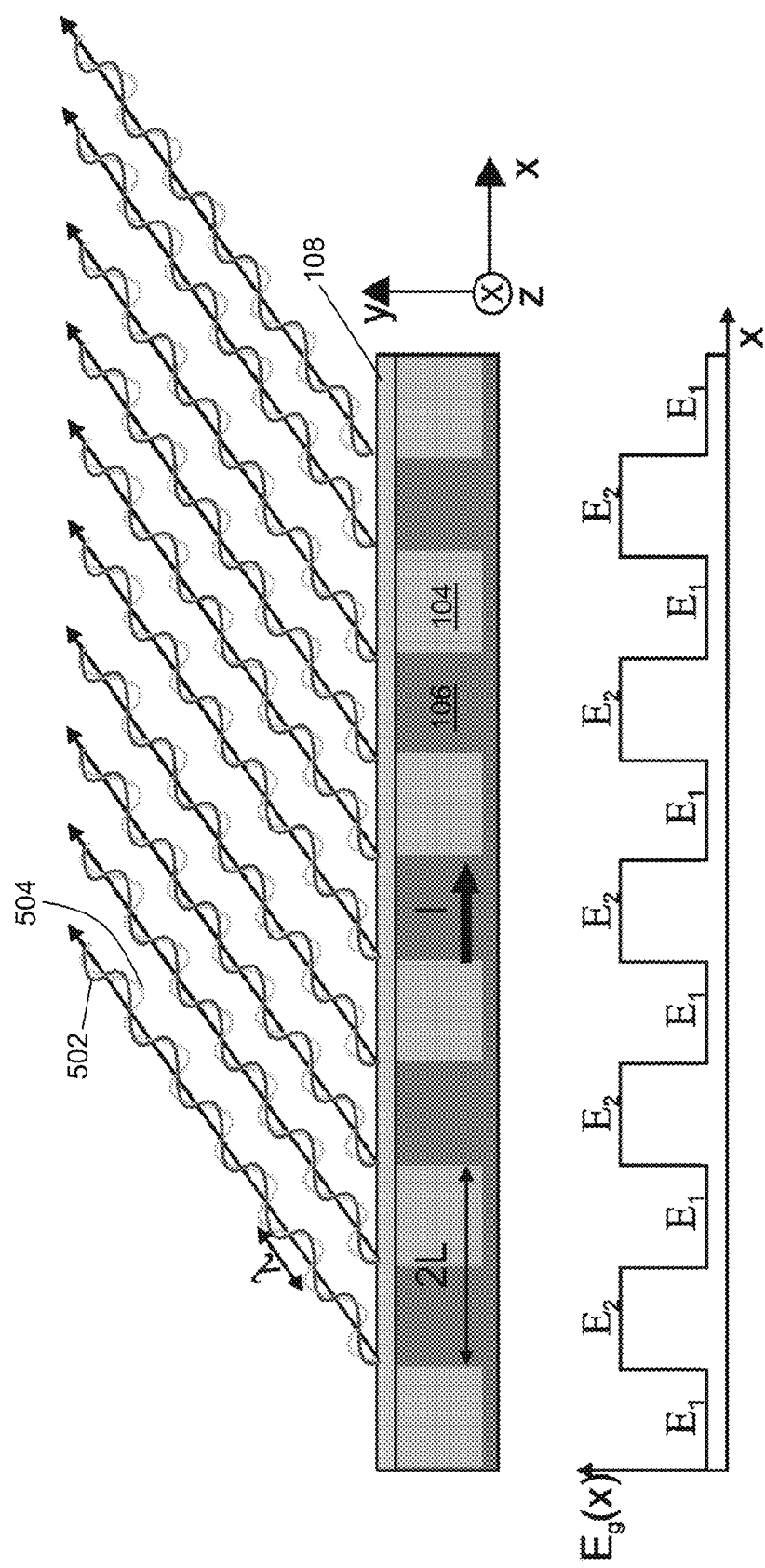
FIG. 5 is a schematic diagram showing a partial cross-sectional view of the radiation source of FIG. 1 in operation (upper panel) and the electric field profile in the electrically conducting film (lower panel).

The devices can be used to generate electromagnetic radiation in accordance with Maxwell's equations, whereby the spatially varying electric field causes the magnetic field (B) 504 that is generated at each of the interfaces between neighboring regions in the film to oscillate with a wavelength λ The oscillating magnetic field, in turn, produces an oscillating electric field (E) 502 with a wavelength λ at the same interfaces. Together B and E form an electromagnetic field that sustains itself and propagates away from the exposed surface of the electrically conducting film opposite the surface that forms the interface with the substrate. The generation of electromagnetic radiation is depicted schematically in FIG. 5, which shows only the radial components ($B_r$ and $E_r$) of the fields for simplicity.

Figure 6:
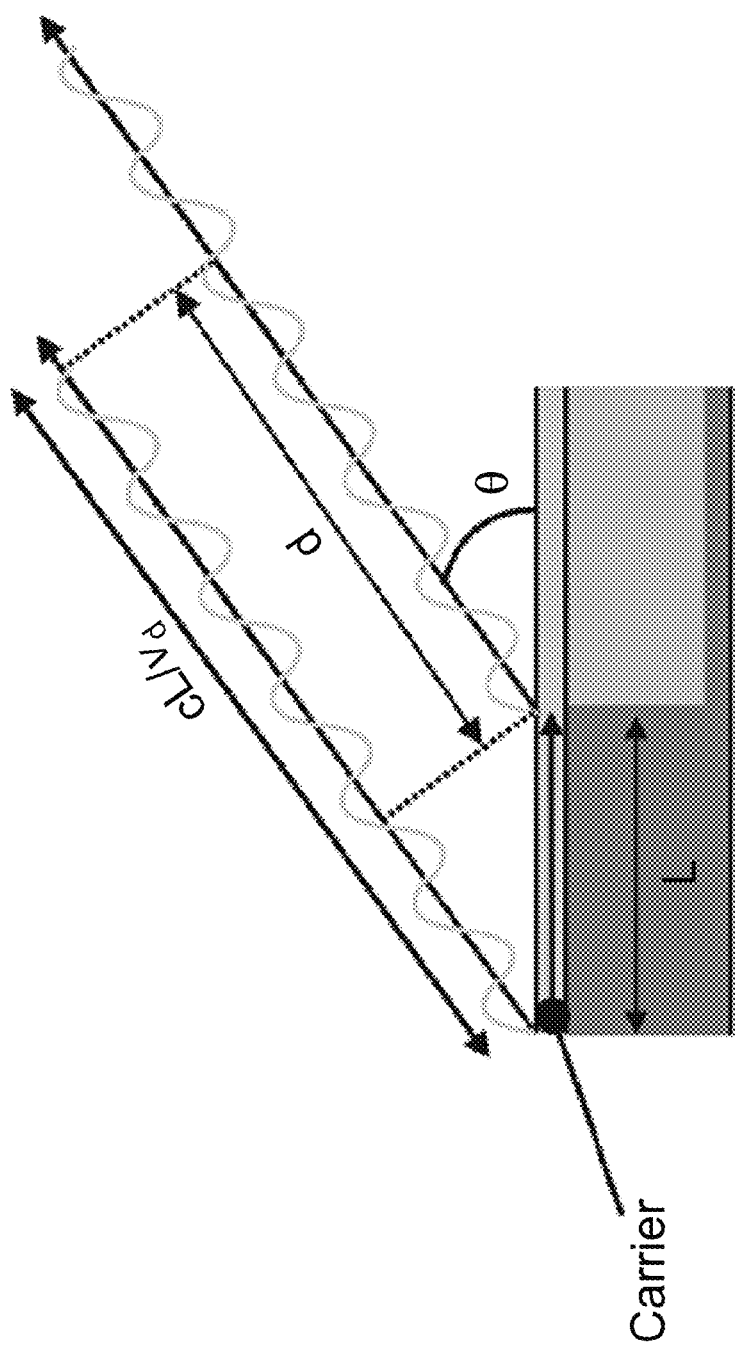
FIG. 6 is a diagram showing various geometric parameters for the radiation source of FIG. 1.

The relationship between the frequency of the electromagnetic radiation, f, and the periodicity of the pattern defined by the substrate surface is shown in equation (1):

$$f = \frac{c}{\lambda} = c \times \left(\frac{cL}{nv_d} - \frac{L\cos\theta}{n}\right)^{-1}, \quad \text{Eq. (1)}$$

where c is the speed of light, λ is the radiation wavelength, n is the harmonic index, $v_d = I/(Aqn_c)$ is the drift velocity of the carriers, where I is the constant current forced in the conducting film by a constant voltage V applied across the film, q is the elementary charge, $n_c$ is the carrier density in the conducting film and A is the cross sectional area of the conducting film. The parameters L, and θ are defined as shown in FIG. 6.

The power of the generated radiation per unit area, corresponding to the Poynting vector, S, is shown in equation (2):

$$S = \frac{c\varepsilon_0}{2}\left(E_1\left|\left(\frac{E_2}{E_1} - 1\right)\right|\right)^2 = \frac{c\varepsilon_0}{2}\left(E_1\left|\left(\frac{\mu_1}{\mu_2} - 1\right)\right|\right)^2 [W/m^2], \quad \text{Eq. (2)}$$

where $\varepsilon_o$ is the vacuum permittivity, $\mu_1$, and $\mu_2$ represent the carrier mobilities in the high- and low-mobility regions of the electrically conducting film, respectively, and $E_1$ and $E_2$ represent the respective electric fields in those regions.

As shown by equation (1), the frequency of the radiation emitted by the present devices can be altered by adjusting the period L of the pattern (i.e., by adjusting the pitch of the surface segments in the embodiment of FIG. 1) at constant $v_d$, which is fixed by the circulating current. The frequency is independent of the materials from which the substrate surface segments are constructed. In contrast, equation (2) shows that the power of the emitted radiation can be altered by adjusting the ratio of the charge carrier mobilities in the different regions of the electrically conducting film, independent of the period of the periodic pattern. Thus, the power output can be tailored by the selection of materials. The decoupling of the device parameters that determine radiation frequency from those that dictate power output provides the present devices with a high degree of design-based tunability. Thus, some embodiments of the electromagnetic radiation sources are able to generate electromagnetic radiation comprising terahertz frequencies (i.e., frequencies in the range from 300 GHz to 3 THz) at room temperature with a high power output. However, the devices can be tailored to generate electromagnetic radiation comprising other frequencies as well, including frequencies across the infrared region of the electromagnetic spectrum.

The materials from which the substrate and electrically conducting film are made should be selected to provide a ratio of charge carrier mobilities that is large enough to produce radiation with sufficient power for an intended application. The electrically conducting material from which the electrically conducting film is composed desirably has a high carrier mobility for either electrons or holes in its natural form. Graphene is an example of a material having a high mobility for electrons that can be used as the electrically conducting film. The graphene may be single layer ("monolayer") graphene or multilayered graphene (e.g., double layer graphene) and may be doped or undoped. However, other single-crystalline electrically conducting materials, such as single-crystalline metals, in thin-sheet form can also be used. Moreover, suitable electrically conducting materials include semiconducting materials in which a charge inversion layer can be formed near the film/substrate interface. In such embodiments, the periodically patterned substrate imposes a periodically varying charge carrier mobility in the inversion layer. A back gate electrode configured to apply a gate voltage across the film can be used to create an inversion layer. Examples of semiconductor materials that can be used in the electrically conducting film include Group IV semiconductors, such as Si, Ge, and their alloys.

As discussed above, the materials from which the surface segments of the substrate are fabricated are selected to provide a carrier mobility differential in regions of the film that are disposed on materially different segments. A great number of materials can be used to satisfy this criterion, including inorganic materials, organic materials, solid material, gasphase material, liquid phase materials, and combination thereof. The first and second materials may differ in their chemical composition and/or in one or more physical attributes, such as degree of crystallinity, surface roughness, etc. . . .

In some embodiments of the radiation sources, one of the surface segment materials is a gas-phase material. The gas may be at atmospheric pressure, above-atmospheric pressure, or below atmospheric pressure—including at pressures so low that the gas is effectively a vacuum space. The gas-phase material may be air, including ambient air at atmospheric pressure. Alternatively the gas-phase material may comprise an inert gas—that is, a gas that does not reacted with the electrically conducting film. The use of a gas-phase material as an underlying substrate can be advantageous because it can minimize the effect of interfacial states on the suspended regions of the electrically conducting film and, therefore, is able to provide high carrier mobility regions in the film. In view of this, it should be understood that in embodiments in which a gas is used as a substrate surface segment material, the gas in contact with the suspended regions of the overlying electrically conducting film is considered to be part of the substrate surface.

By way of illustration, if graphene is used as the electrically conducting film, $SiO_2$ may be used for the substrate surface segments of the first material, while air (e.g., ambient air or air at a reduced pressure) may be used for the substrate surface segments of the second material. In this design, the regions of the electrically conducting film disposed on the $SiO_2$ surface segments would provide "high" electron mobility regions, while the region of the electrically conducting film disposed over the air segments would provide "low" electron mobility regions. However, other materials may be employed. Methods for determining the electron mobility in graphene grown or deposited on different materials are known. See, for example, Table 3 in Cooper et al., *ISRN Cond. Matter Phys.*, 2012 (2012) Article ID 501686. For some applications, it may be desirable to have a large carrier mobility differential between the different regions of the film. For example, in some embodiments, the carrier mobility in the regions of the electrically conducting film that are disposed on surface segments of the first material is at least twice the mobility of the charge carriers in regions of the electrically conducting film that are disposed on surface segments of the second material. This includes embodiments in which the carrier mobility in the regions of the electrically conducting film that are disposed on surface segments of the first material is at least ten times the mobility of the charge carriers in regions of the electrically conducting film that are disposed on surface segments of the second material. However, materials providing a lower carrier mobility differential can also be used.

In some embodiments, the first and second materials of the surface segments differ In that one of the materials is single-crystalline and the other material is amorphous. In other embodiments, the first and second materials of the surface segments differ in that the one of the materials provides a smooth interface between the substrate and the electrically conducting film and the other material has a surface that is roughened, relative to that of the first material, such that is provides a rough interface between the substrate and the electrically conductive film. In such embodiments, the first and second materials may have the same chemical constituents, but are different in their structure. For example, the first and second materials may be single-crystalline silicon and amorphous silicon or vice versa.

Figure 7:
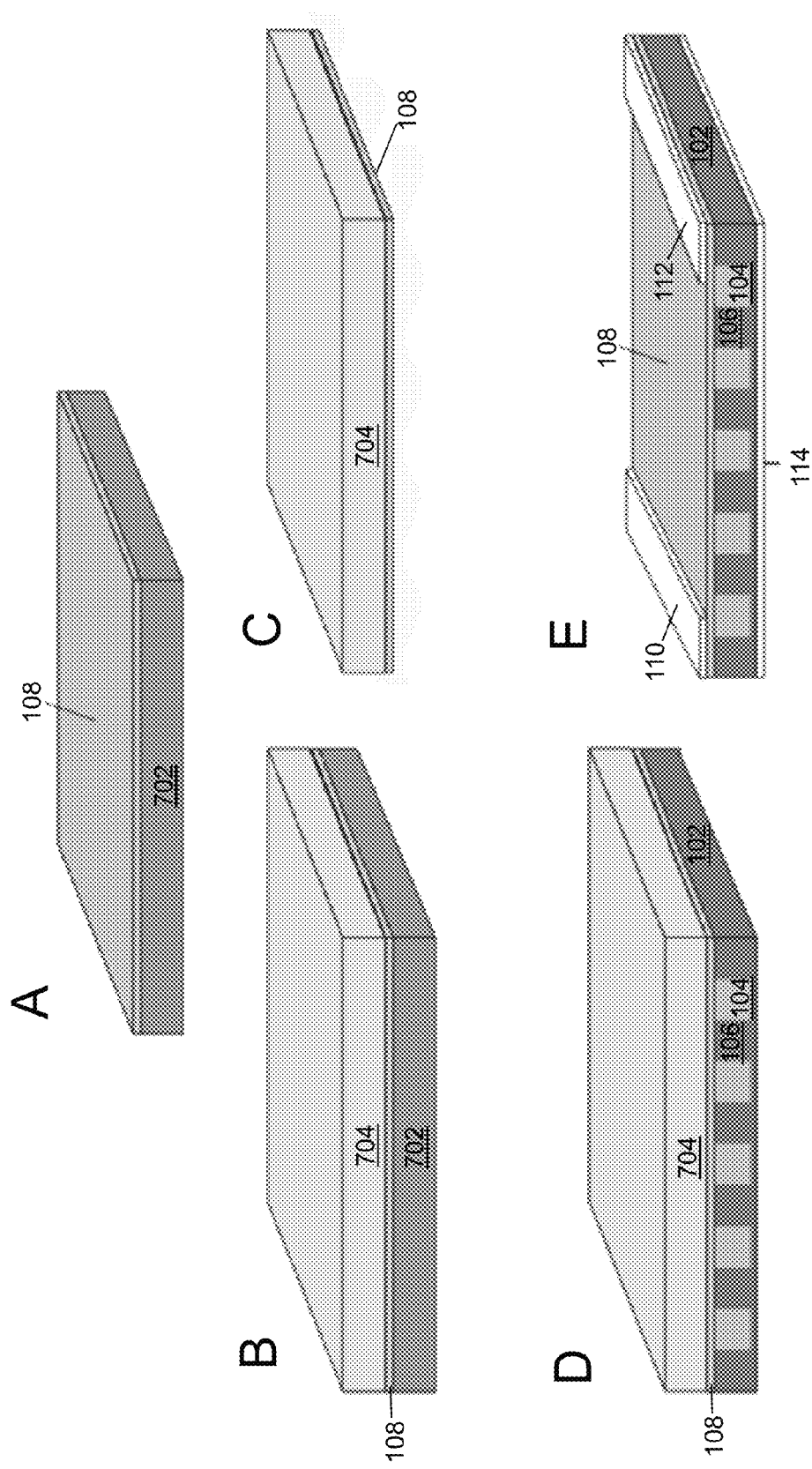
FIG. 7 is a schematic diagram showing a processing scheme for the fabrication of the electromagnetic radiation source of FIG. 1.

FIG. 7 is a schematic illustration of a process than can be used to provide a planar electrically conducting film having a periodic, anisotropic charge carrier mobility on a periodically patterned substrate. In this process, a film of electrically conducting material 108 is grown or deposited on a growth substrate 702 (panel (A)). The exposed surface of the electrically conductive film is then contacted with a host substrate 704, to which it adheres (panel (B)). (Host substrate 704 should be thick enough to allow the electrically conducting film to remain planar when it is subsequently transferred to the periodically patterned substrate.) The growth substrate is then selectively removed from the structure by, for example, selectively etching in an etchant solution, to expose the lower surface of the electrically conducting film (panel (C)). The newly exposed lower surface of the electrically conducting film is then contacted with the upper surface of the periodically patterned substrate 102, to which it adheres (panel (D)). Host substrate 704 is then removed from the structure and first and second contacts 110 and 112 are deposited on the exposed upper surface of the electrically conducting film (panel (E)). Methods of transferring and releasing thin films from sacrificial substrates and host substrates are known. A description of these processes may be found in U.S. patent application publication number 2007/0187719.

EXAMPLE

Single-layer graphene is grown by chemical vapor deposition (CVD) on a copper foil that is held flat by two parallel glass sheets. Polymethylmethacrylate (PMMA) is then spun onto an exposed graphene surface at 5000 rpm for 60 seconds. The resulting structure is then moved to a hot plate and baked at 90° C. for 5 min.

Because graphene grown with CVD deposits on both sides of the Cu foil, the back-side graphene must be removed by etching before the copper can be removed. The combination PMMA/graphene/copper foil/graphene is mounted on a Si wafer PMMA side down and plasma etched in a 100 W $O_2$ plasma for 10 s. The Cu is removed next by wet etching in a 0.2 M $FeCl_3$ solution. The Cu foil is left in the $FeCl_3$ solution for ~16 h. The spin coated PMMA faces up in the etching solution.

After the Cu foil is completely removed, the graphene/PMMA film will float on the $FeCl_3$ solution. This bilayer structure is removed with a glass handling substrate, either $SiO_2$ on Si or a glass slide, immersed immediately in deionized (DI) water, and left there for 10 min to remove any remaining etching solution. The DI water cleaning is repeated 3 times using fresh DI water each time. The graphene/PMMA stack is then removed from the DI water using a substrate having a surface comprising a plurality of surface segments of a first material and a plurality of surface segments of a second material, as described above, as a host substrate.

After transfer of the graphene/PMMA film to the final host substrate, any remaining water is allowed to evaporate (10 min) and the host/graphene/PMMA structure is spun at 2000 rpm for 1 min and annealed on a hot plate at 110° C. for 5 min. The PMMA is then removed in boiling acetone for 5 min followed by 5 min in boiling isopropyl alcohol (IPA). Solvent residue is finally removed by a blow dry step.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. An electromagnetic radiation source comprising:
    a substrate having a surface, the surface comprising a plurality of surface segments of a first material and a plurality of surface segments of a second material, wherein the surface segments of the first and second materials are arranged in a periodic pattern;
    an electrically conducting film comprising an electrically conducting material disposed over the surface of the substrate;
    first and second electrical contacts in electrical communication with the electrically conducting film; and
    a voltage source configured to apply a voltage across the electrically conducting film, wherein the voltage source and the first and second electrical contacts are configured to induce charge carriers to pass through the plane of the electrically conducting film parallel to the surface of the substrate;
    wherein the mobility of charge carriers in regions of the electrically conducting film that are disposed on surface segments of the first material differs from the mobility of the charge carriers in regions of the electrically conducting film that are disposed on surface segments of the second material, such that the charge carriers have a periodically varying mobility within the plane of the electrically conducting film;
    and further wherein the electrically conducting film is characterized in that the periodically varying mobility of the charge carriers in the electrically conducting film results in the emission of electromagnetic radiation from the electrically conducting film when the charge carriers pass through the electrically conducting film.

2. The source of claim 1, wherein the electrically conducting film is a single layer of graphene.

3. The source of claim 2, wherein at least one of the first and second materials is silicon, germanium or silicon dioxide.

4. The source of claim 1, wherein the first material is a gas-phase material and the second material is one that provides charge carriers in regions of the electrically conducting film that are disposed on surface segments of the second material with a lower mobility than in regions of the electrically conducting films that are disposed over the gas-phase material.

5. The source of claim 4, wherein the gas-phase material comprises an inert gas.

6. The source of claim 4, wherein the gas-phase material has a gas pressure less than atmospheric pressure.

7. The source of claim 1, wherein the periodic pattern comprises repeating AB units, wherein A represents the first material and B represents the second material.

8. The source of claim 1, wherein the periodicity of the periodic pattern of the surface segments is configured such that terahertz radiation is generated when the charge carriers pass through the electrically conducting film.

9. The source of claim 7, wherein the periodicity of the AB units is configured such that terahertz radiation is generated when the charge carriers pass through the electrically conducting film.

10. The source of claim 1, wherein the mobility of the charge carriers in the regions of the electrically conducting film that are disposed on surface segments of the first material is at least twice the mobility of the charge carriers in regions of the electrically conducting film that are disposed on surface segments of the second material.

11. An electromagnetic radiation source comprising:
a substrate having a surface, the surface comprising a plurality of surface segments of a first material and a plurality of surface segments of a second material, wherein the surface segments of the first and second materials are arranged in a periodic striped pattern;
an electrically conducting film comprising graphene;
first and second electrical contacts in electrical communication with the grapheme; and
a voltage source configured to apply a voltage across the graphene, wherein the voltage source and the first and second electrical contacts are configured to induce electrons to pass through the plane of the graphene parallel to the surface of the substrate;
wherein the mobility of electrons in regions of the graphene that are disposed on surface segments of the first material differs from the mobility of electrons in regions of the graphene that are disposed on surface segments of the second material, such that the electrons have a periodically varying mobility within the plane of the graphene;
and further wherein the graphene is characterized in that the periodically varying mobility of the electrons in the graphene results in the emission of terahertz radiation from the graphene when the electrons pass through the graphene.

12. A method of generating electromagnetic radiation using the source of claim 1, the method comprising applying a voltage across the electrically conducting film to induce a flow of charge carriers through the plane of the electrically conducting film parallel to the surface of the substrate, wherein the periodically varying mobility of the charge carriers in the electrically conducting film results in the emission of the electromagnetic radiation from the electrically conducting film.

13. The method of claim 12, wherein the electromagnetic radiation comprises terahertz radiation.

14. A method of generating terahertz radiation using the source of claim 11, the method comprising applying a voltage across the electrically conducting film to induce a flow of electrons through the graphene, wherein the periodically varying mobility of the electrons in the graphene results in the emission of the electromagnetic radiation from the graphene.

15. The source of claim 1, wherein the first material or the second material is a gas-phase material.

16. The source of claim 11, wherein the first material or the second material is a gas-phase material.

* * * * *